(12) United States Patent
Thannhuber

(10) Patent No.: US 11,532,842 B2
(45) Date of Patent: Dec. 20, 2022

(54) BATTERY MANAGEMENT SYSTEM FOR A LITHIUM ION BATTERY OF AN ELECTRICAL APPLIANCE AND METHOD FOR OPERATING A LITHIUM ION BATTERY OF AN ELECTRICAL APPLIANCE

(71) Applicant: Einhell Germany AG, Landau/Isar (DE)

(72) Inventor: Markus Thannhuber, Landau (DE)

(73) Assignee: Einhell Germany AG, Landau/Isar (DE)

( * ) Notice: Subject to any disclaimer, the term of this patent is extended or adjusted under 35 U.S.C. 154(b) by 447 days.

(21) Appl. No.: 16/619,718

(22) PCT Filed: May 29, 2018

(86) PCT No.: PCT/EP2018/064071
§ 371 (c)(1),
(2) Date: Dec. 5, 2019

(87) PCT Pub. No.: WO2018/224358
PCT Pub. Date: Dec. 13, 2018

(65) Prior Publication Data
US 2020/0099112 A1    Mar. 26, 2020

(30) Foreign Application Priority Data

Jun. 6, 2017  (DE) ............. 10 2017 112 355.5

(51) Int. Cl.
*H01M 10/48* (2006.01)
*G01R 31/387* (2019.01)
(Continued)

(52) U.S. Cl.
CPC ...... *H01M 10/482* (2013.01); *G01R 31/3647* (2019.01); *G01R 31/387* (2019.01);
(Continued)

(58) Field of Classification Search
None
See application file for complete search history.

(56) References Cited

U.S. PATENT DOCUMENTS

2006/0220605 A1 * 10/2006  Funabashi ........... H01M 50/204
                                                                318/434
2007/0292764 A1 * 12/2007  Soma .................. H01M 4/1391
                                                                429/231.95
(Continued)

FOREIGN PATENT DOCUMENTS

| DE | 102009020271 A1 | 12/2010 |
| DE | 102013021637 A1 | 7/2014 |
| DE | 102015106545 A1 | 11/2015 |

OTHER PUBLICATIONS

PCT; App No. PCT/EP2018/064071; International Search Report and Written Opinion dated Jul. 17, 2018.

*Primary Examiner* — Jas A Sanghera
(74) *Attorney, Agent, or Firm* — Fitch, Even, Tabin & Flannery, LLP

(57) ABSTRACT

The invention relates to a battery management system for a lithium ion battery of an electrical appliance, in particular an electrical hand tool or electrical gardening tool, which is configured in order to determine a difference between a current required by the electrical appliance and a predetermined measuring current which can be provided electrochemically by means of the lithium ion battery, and to cover the difference using a dielectric capacitance of the lithium ion battery in so far as this does not result in departure from predetermined acceptable operating states of the lithium ion battery. The invention further relates to a method for operating a lithium ion battery of an electrical appliance.

9 Claims, 4 Drawing Sheets

(51) Int. Cl.
*G01R 31/389* (2019.01)
*G01R 31/392* (2019.01)
*G01R 31/36* (2020.01)
*H01M 10/42* (2006.01)

(52) U.S. Cl.
CPC ......... *G01R 31/389* (2019.01); *G01R 31/392* (2019.01); *H01M 10/425* (2013.01); *H01M 2010/4271* (2013.01); *H01M 2220/30* (2013.01)

(56) References Cited

U.S. PATENT DOCUMENTS

2010/0085057 A1* 4/2010 Nishi .................... H01M 10/44
324/427
2015/0321572 A1 11/2015 Koch et al.

* cited by examiner

BATTERY MANAGEMENT SYSTEM FOR A LITHIUM ION BATTERY OF AN ELECTRICAL APPLIANCE AND METHOD FOR OPERATING A LITHIUM ION BATTERY OF AN ELECTRICAL APPLIANCE

CROSS-REFERENCE TO RELATED APPLICATIONS

This application is a U.S. national phase application of International Application No. PCT/EP2018/064071, filed May 29, 2018, designating the United States, which claims priority to German Patent Application No. 10 2017 112 355.5, filed Jun. 6, 2017.

FIELD

The invention relates to a battery management system for a lithium ion battery of an electrical appliance and to a method for operating a lithium ion battery of an electrical appliance. Further, the invention also relates to a lithium ion battery for an electrical appliance as well as to an electrical appliance.

BACKGROUND

Electrical appliances such as for example electrical hand tools or electrical gardening tools are increasingly often supplied with the required energy by means of lithium ion batteries. Lithium allows supplying largest cell voltages in technical configurations usual today of up to 3.6 V of energy.

Basically, there is a plurality of lithium ion cells, but only few of these cells are suitable for electrical appliances, which have very high current requirements for a short time. In particular, this is the case in electrically operated hand tools or electrically operated gardening tools. Therefore, lithium ion batteries are usually used in applications, in which it especially comes down to particularly long operating times, but not to the compliance with particularly high current requirements in the form of current peaks. Classically, lithium ion batteries are particularly well suited for electronic applications such as for example notebooks, computers, cell phones and the like. All of these appliances are characterized in that they especially are to particularly long operate without particularly high loads and thus current peaks appearing therein.

Compared to electrical hand tools and electrical gardening tools, such electronic appliances are characterized in that the current requirements are relatively low and very uniform. In contrast, electrical hand tools and electrical gardening tools are to be particularly powerful and require a corresponding current and energy supply, respectively, by lithium ion batteries correspondingly suitable thereto. The current requirements of electrical hand tools and electrical gardening tools are usually characterized by a particularly high average current drain and by occasionally particularly very high current peaks.

The occurring current peaks in electrical hand tools and electrical gardening tools are partially up to 100 times higher than in conventional electronic appliances such as for example cell phones and the like. For electrical hand tools and electrical gardening tools, the high capacitances of the lithium ion batteries are first very nice, but here the capacitance is not the actually limiting factor. Here, it is the performance, thus the power output in Watts. In working with a hand-held circular saw or with an angle grinder, one requires enormous powers at the moment of cutting or at the moment of grinding. Here, the batteries have to be able to discharge within shortest time. It is also important that the recharge of lithium ion batteries proceeds fast in context of electrical hand tools or electrical gardening tools such that it can be substantially continuously operated with for example only two battery packs on lithium ion basis by alternately discharging and charging the two battery packs.

Therefore, it is the object of the present invention to provide a solution, by means of which electrical appliances with particularly high current requirements and in particular with high current peaks can be reliably supplied with energy by means of lithium ion batteries.

SUMMARY

This object is solved by a battery management system for a lithium ion battery as well as by a method for operating a lithium ion battery having the features of the independent claims. Advantageous configurations with convenient and non-trivial developments of the invention are specified in the dependent claims.

The battery management system according to the invention for a lithium ion battery of an electrical appliance, in particular of an electrical hand tool or electrical gardening tool, is configured to determine a difference between a current requirement of the electrical appliance and a preset rated current, which can be electrochemically provided by means of the lithium ion battery. Furthermore, the battery management system according to the invention is configured to cover the difference using a dielectric capacitance of the lithium ion battery insofar as it is thereby not departed from preset acceptable operating states of the lithium ion battery.

Therein, the invention is based on the realization that electrical appliances, in particular electrical hand tools or electrical gardening tools, can well have particular current requirements with high current peaks. The particularity of such electrical appliances is in that very high current peaks have to be covered by employed lithium ion batteries for a short time. These high current peaks are caused in that these electrical appliances represent electromotive applications, in which masses are accelerated to high rotational speeds and high velocities and decelerated, respectively. Therein, enormous forces and torques act. They additionally occur in unpredictable and often undefined manner. Be it e.g. a nail in the board with a battery-powered saw, e.g. a stone in the grass with a battery-powered lawn mower, e.g. a chip, which is located between workpiece and tool and blocks the tool, with a battery-powered milling cutter or the like. Already starting and braking such an electrical appliance results in enormous and spontaneous power requirement. The diffusion and reaction speeds in lithium ion batteries are simply not sufficient for covering such extreme current requirements.

In this context, the invention is based on the realization that lithium ion batteries additionally behave very similar to double-layer capacitors. The lithium ion cell is actually a small capacitor. A very special effect accrues the lithium ion cells: Charge separation in the form of ion congestion occurs at the interfaces between electrolyte and in particular the anode. Therein, the charges of different polarity are opposing each other at smallest distance. This corresponds to the structure of a double-layer capacitor. Double-layer capacitors are characterized by a particularly high capacitance. Thus, the electrochemistry of the lithium ion cell develops a potent dielectric effect in the form of a particularly high present dielectric capacitance with suitable design. Especially this effect is required to be able to operate electrical appliances like electrical hand tools or electrical gardening tools with particularly high current requirements and high peak currents in high-quality manner. By means of the battery management system according to the invention, it is possible to in particular cover particularly high current peaks and inherently high current requirements above a preset rated current, which can be electrochemically provided by means of the lithium ion battery.

By means of the battery management system according to the invention, it is possible to utilize the dielectric effect of lithium ion batteries inherent in the system in the form of the present dielectric capacitance in adequate and secure manner at the same time.

The battery management system is capable of ascertaining based on a present current requirement of the electrical appliance, which is for example provided by means of a motor control unit. In addition, the battery management system can ascertain, at which portion this current requirement can be electrochemically provided by means of the lithium ion battery anyway. In other words, the battery management system can thus optionally determine a present discrepancy between the existing current requirement and the purely electrochemically suppliable energy by the lithium ion battery. The battery management system is configured to cover this difference using the dielectric capacitance of the lithium ion battery as far as it is thereby not departed from preset acceptable operating states of the lithium ion battery. Thus, respective dielectric capacitances of the individual cells of the lithium ion battery can be used by means of the battery management system upon need to cover current requirements of the electrical appliance, which otherwise inherently cannot be complied with due to the electrochemical metabolism of the lithium ion battery. The current capable of being electrochemically provided and the amount of charge capable of being electrochemically provided per time unit, respectively, are determined by diffusion processes, accelerations and by repelling or attracting forces in the potential field of the lithium ion battery. Further, the maximally possible reaction speeds in the lithium ion battery determine to what extent it can meet present current requirements in purely electrochemical manner.

A possibly present difference between a current requirement of the electrical appliance and the said rated current means that the electrical appliance inherently requires more current than the lithium ion battery can provide anyway in the intended operation due to its normal cell chemistry. Here, the battery management system according to the invention intervenes in that it covers or provides this difference using the dielectric capacitance of the lithium ion battery insofar as it is thereby not departed from preset acceptable operating states of the lithium ion battery. Thereby, it is possible by means of the battery management system to operate lithium ion batteries such that they can comply with particularly high current requirements, in particular particularly high current peaks, in adequate and particularly secure manner at the same time.

Thereby, overload of the dielectric capacitances within the lithium ion battery can be prevented on the one hand. The occurrence of inhomogeneous current paths in the electrodes of the lithium ion battery with local thermal overloads associated therewith can thereby be reliably prevented. Similarly, over-stimulation of the electrochemical metabolism of the lithium ion battery can be reliably prevented by means of the battery management system according to the invention.

Thus, by means of the battery management system according to the invention, it is possible to optimally exploit the potentials of lithium ion batteries with regard to their dielectric capacitances to adequately and securely comply with particularly high current requirements of electrical appliances.

An advantageous embodiment of the invention provides that the battery management system is configured to cover the difference considering a current state of charge of the dielectric capacitance of the lithium ion battery. Thus, the battery management system is capable of capturing and considering respectively actual states of charge of the dielectric capacitance of the lithium ion battery. For example, if the dielectric capacitance of the lithium ion battery was just consumed in large parts, thus, the battery management system can recognize this. As a result, it can be ensured that the battery management system does not unduly use the dielectric capacitance of the lithium ion battery to comply with the said difference between the current requirement of the electrical appliance and the preset rated current, which can be electrochemically provided by means of the lithium ion battery.

A further advantageous embodiment of the invention provides that the battery management system is configured to cover the difference considering a charging behavior of the dielectric capacitance of the lithium ion battery. Thus, the battery management system can consider how fast or how slowly the dielectric capacitance of the concerned lithium ion battery can be recharged. Thereby, the dielectric capacitance of the lithium ion battery can also be particularly well utilized.

In further advantageous configuration of the invention, it is provided that the battery management system is configured to recognize different types of current peaks based on the current requirement and to use the dielectric capacitance of the lithium ion battery depending thereon for covering the difference between the current requirement of the electrical appliance and the preset rated current. In other words, the battery management system can thus perform a type of current profiling. Current peaks can be certain current progressions over time, wherein the current strength is above the rated current over the entire progression of the respective current peaks. Preferably, the battery management system is configured to compare preset current progressions for the different types of current peaks to the current requirement and to recognize the respective types of current peaks based thereon. For example, current profiles for various events can be recorded. Such events can for example relate to the start of inertial masses of the electrical appliance, certain operating pulses, material inhomogeneities and the like. By comparison of the currently present current requirement to these recorded current progressions, the battery management system can recognize, which type of current peak and corresponding characteristic of the current progression over the time have to be expected. Based thereon, the battery management system can optimally use the dielectric capacitance of the lithium ion battery for covering the difference between the current requirement of the electrical appliance and the preset rated current.

In further advantageous configuration of the invention, it is provided that the battery management system is configured to control the use of the dielectric capacitance of the lithium ion battery depending on at least one of the following quantities:

a temperature of the lithium ion battery, in particular of respective cells of the lithium ion battery;

an internal resistance of the lithium ion battery, in particular of respective cells of the lithium ion battery;

a state of charge of the lithium ion battery, in particular of respective cells of the lithium ion battery;

a state of health, usually referred to as state of health, of the lithium ion battery, in particular of respective cells of the lithium ion battery.

All of these mentioned quantities are suitable to determine preset acceptable operating states of the lithium ion battery such that the battery management can use the dielectric capacitance of the lithium ion battery considering one or all of these quantities such that the lithium ion battery is not damaged thereby.

The lithium ion battery according to the invention for an electrical appliance, in particular for an electrical hand tool or an electrical gardening tool, includes the battery management system according to the invention or an advantageous embodiment of the battery management system according to the invention.

The electrical appliance according to the invention, in particular in the form of an electrical hand tool or electrical gardening tool, includes the lithium ion battery according to the invention with the said battery management system. The electrical appliance can for example be battery-operated screwdrivers, drilling machines, drill hammers, saws, grinding machines and the like. In addition, the electrical appliance can for example also be battery-operated gardening tools in the form of lawn mowers, scarifiers, hedge clippers, chainsaws and the like.

In the method according to the invention for operating a lithium ion battery of an electrical appliance, in particular of an electrical hand tool or an electrical gardening tool, a difference between a current requirement of the electrical appliance and a preset rated current, which can be electrochemically provided by means of the lithium ion battery, is determined by means of the battery management system according to the invention or an advantageous embodiment of the battery management system according to the invention and the difference is covered using a dielectric capacitance of the lithium ion battery insofar as it is thereby not departed from preset acceptable operating states of the lithium ion battery. Advantageous configurations of the battery management system according to the invention are to be regarded as advantageous configurations of the method according to the invention and vice versa, wherein the battery management system in particular comprises means for performing the method steps.

Further advantages, features and details of the invention are apparent from the following description of a preferred embodiment as well as based on the drawing.

The features and feature combinations mentioned above in the description as well as the features and feature combinations shown below in the description of figures and/or in the figures alone are usable not only in the specified combination, but also in other combinations or alone without departing from the scope of the invention.

BRIEF DESCRIPTION OF THE DRAWINGS

The drawings show in.

In the figures, identical or functionally identical elements have been provided with the same reference characters.

DESCRIPTION OF THE PREFERRED EMBODIMENTS

Figure 1:
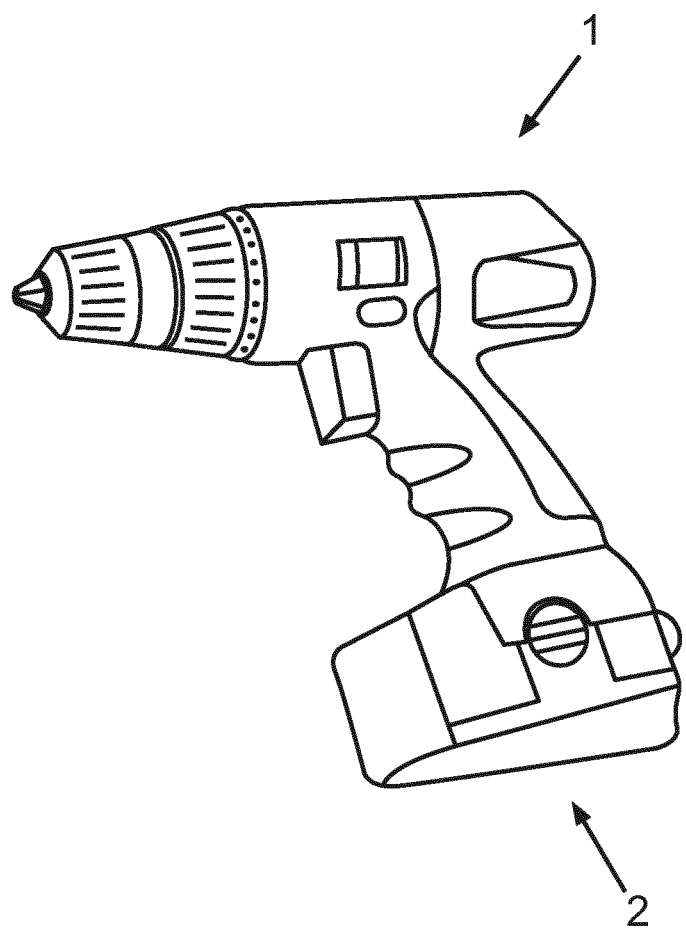
FIG. 1 a perspective view of a battery-operated drill driver with an exchangeable lithium ion battery, which is attached to the bottom side of the battery-operated drill driver.

The battery-operated drill driver 1 is shown in a perspective view in FIG. 1. A lithium ion battery 2 in the form of an exchangeable battery pack is attached to the bottom side of the battery-operated drill driver 1. Below, it is exemplarily described for the battery-operated drill driver how such a lithium ion battery 2 can be best possible operated to satisfy the current requirement of the battery-operated drill driver 1. The following explanations are only to be understood in exemplary manner for the battery-operated drill driver 1. They similarly apply to all electrical appliances with high current requirements, in which in particular high current peaks occur. Thus, the battery-operated drill driver is representative of very different electrical hand tools or electrical gardening tools such as for example battery-operated drilling machines, milling machines, grinding machines, lawn mowers, scarifiers, chainsaws and the like, which are all operated by means of lithium ion batteries.

Figure 2:
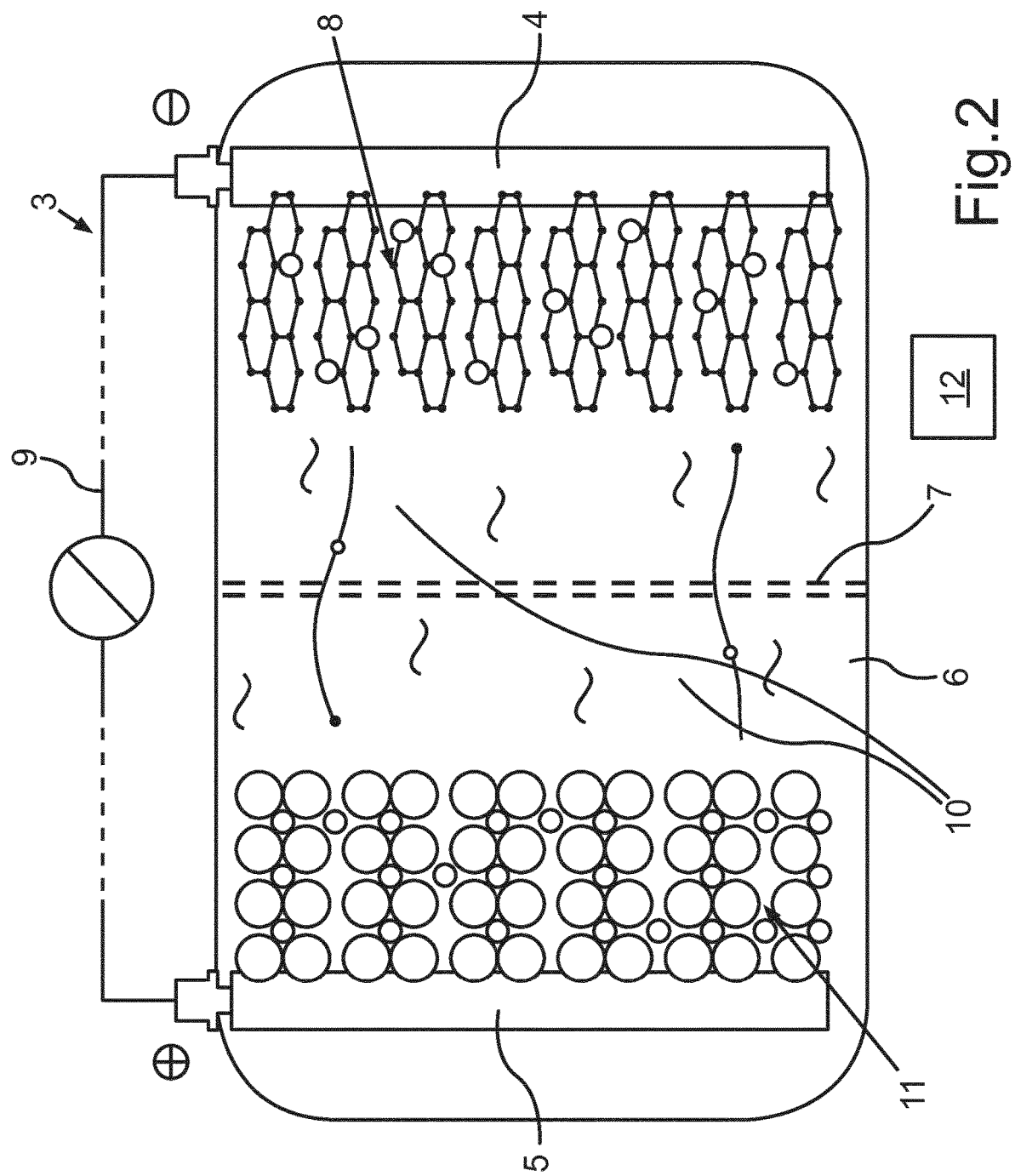
FIG. 2 a schematic representation of one of many battery cells of the lithium ion battery, wherein a battery management system for controlling the lithium ion battery is additionally schematically illustrated.

In FIG. 2, a battery cell 3 of the lithium ion battery 2 is schematically illustrated. The battery cell 3 includes an anode 4 and a cathode 5, which are immersed in a non-aqueous electrolyte solution 6. Therein, the anode 4 and the cathode 5 are separated by a separator 7. In addition, the anode 4 includes a graphite intercalation compound 8, wherein lithium is present as a cation. In discharging, the graphite intercalation compound 8 donates electrons, which flow to the cathode 5 via an external circuit 9. At the same time, an equal number of lithium ions 10 migrate from the intercalation compound 8 through the electrolyte 6 to the cathode 5. At the cathode 5, not the lithium ions 10 accept the electrons of the external circuit 9, but the structures of transition metal compounds 11 present there.

In addition, a battery management system 12 is also schematically indicated in FIG. 2, which serves for monitoring and controlling the battery cells 3 and thus the lithium ion battery 2. The battery management system 12 can for example be an electronic circuit, which can also comprise comprehensive power electronics.

Figure 3:
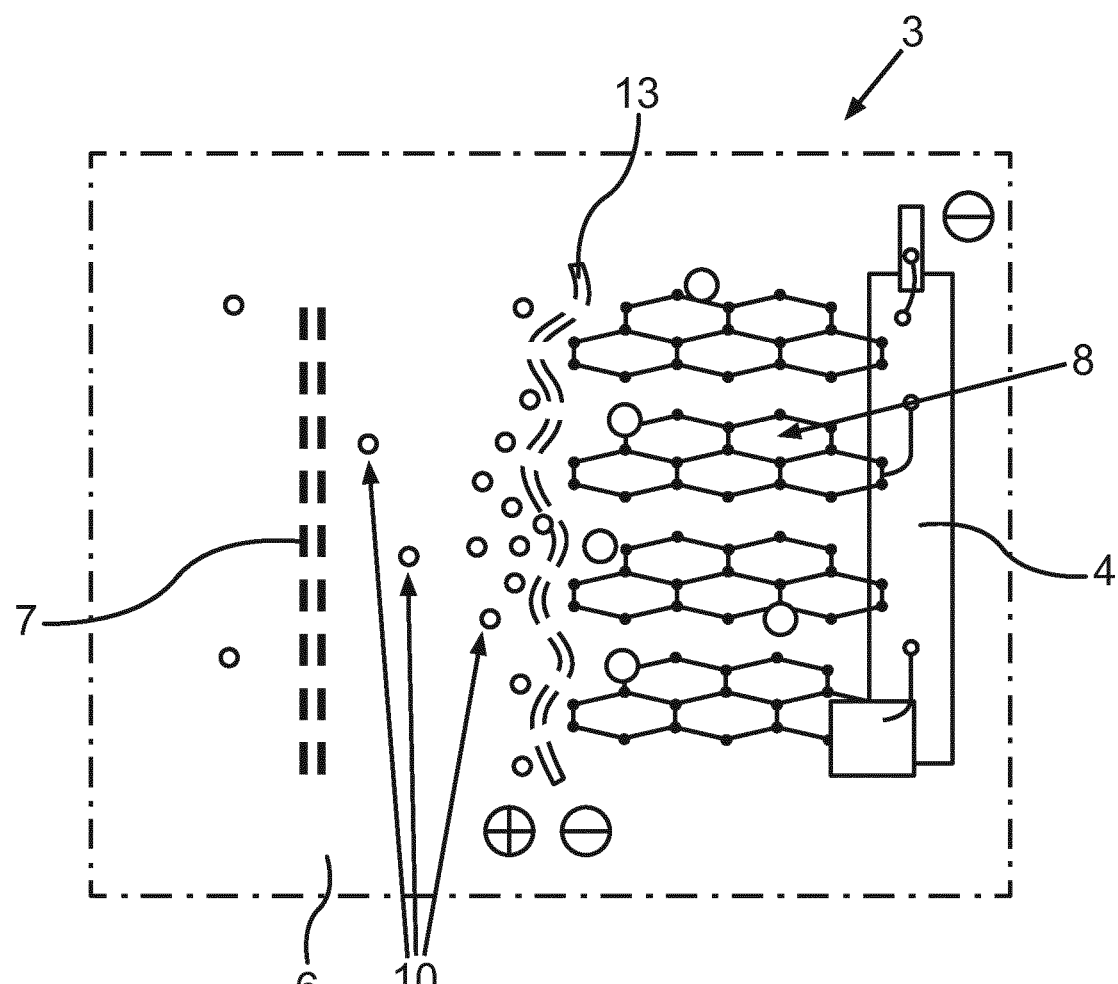
FIG. 3 an enlarged schematic representation of a section of the battery cell, wherein a passive boundary layer at an interface between an anode and an electrolyte is illustrated, where formation of a dielectric capacitance occurs due to ion congestion; and in FIG. 4 a schematic representation of a current profile with different current peaks, which can occur in the operation of the battery-operated drill driver.

In FIG. 3, a section of the battery cell 3 is illustrated, wherein a passive boundary layer 13 is schematically illustrated, which has formed at an interface between the anode 4 and the electrolyte 6 not designated in more detail, which arises by the decomposition of the electrolyte 6. Usually, the passive boundary layer 13 is also referred to as solid electrolyte interface, briefly SEI.

In the area of this passive boundary layer 13, a dielectric capacitance forms within the respective battery cells 3 by a type of ion congestion. This dielectric capacitance is comparable to that of a double-layer capacitor concerning its functionality and its characteristics.

Charge separation occurs at the passive boundary layer 13 due to an ion congestion. Charges of different polarity are opposing each other at lowest distance at this passive boundary layer 13. As in a double-layer capacitor, the dielectric capacitance formed in the area of the passive boundary layer 13 is characterized by a particularly high capacitance. The battery management system 12 schematically indicated in FIG. 2 takes advantage of this characteristic of the lithium ion battery 2 inherent in the system.

Figure 4:
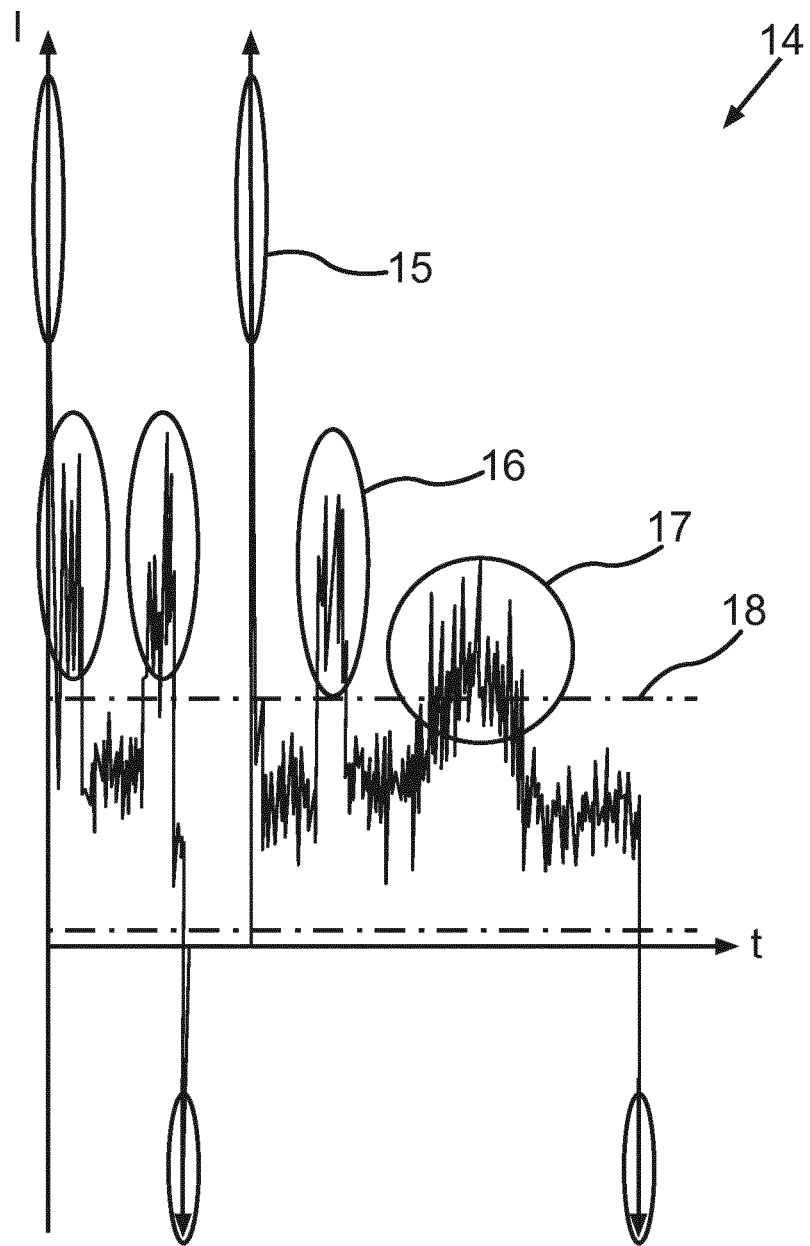

In FIG. 4, a current requirement 14 in the form of a current profile for the battery-operated drill driver 1 is schematically indicated. The current requirement 14 of the battery-operated drill driver 1 is thus plotted as a current progression I over the time t. Within the diagram, different types of current peaks 15, 16, 17 are exemplarily drawn for the current requirement 14. For example, the current peak 15 turns out particularly abrupt and particularly high with respect to the current. The current peaks 16, 17 turn out slightly lower, but remain longer at a relatively high value. In the diagram, a preset rated current 18 is additionally identified, which can be electrochemically provided by means of the lithium ion battery 2 due to its electrochemical metabolism. The rated current 18 is determined by diffusion processes, accelerations, by repelling or attracting forces in the potential field of the battery cells 3 and the reaction speeds in the battery cells 3.

As is apparent, the current requirement 14 is characterized by very abrupt and severe excursions with respect to the current I. Purely electrochemically, the lithium ion battery 2 would not be capable of satisfying the current requirement 14 with regard to the different current peaks 15, 16, 17 at all due to its relatively slow electrochemical metabolism. At this place, the previously described dielectric capacitance, which arises due to the ion congestion in the area of the passive boundary layer 13, is employed.

The battery management system 12 is configured to determine a difference between the current requirement 14 of the battery-operated drill driver 1 shown here and the preset rated current 18, which can be purely electrochemically provided by means of the lithium ion battery 2. The battery management system 12 can cover this determined difference using the said dielectric capacitance of the lithium ion battery 2 insofar as it is thereby not departed from preset acceptable operating states of the lithium ion battery 2. Therefore, the current peaks 15, 16, 17 can be completely or at least partially complied with by means of the lithium ion battery 2 by a skillful control by the battery management system 12, although the slow electrochemical metabolism of the battery cells 3 inherently would not be capable thereof at all.

Therein, the battery management system 12 is capable of considering the different current peaks 15, 16, 17 by a particularly fast current profiling. Thus, the battery management system 12 can recognize the different types of the current peaks 15, 16, 17 and use the dielectric capacitance of the lithium ion battery 2 depending thereon for covering the difference between the current requirement 14 of the battery-operated drill driver 1 and the preset rated current 18. For example, preset current progressions for the different types of current peaks 15, 16, 17 can be stored on a data carrier and provided to the battery management system 12. The battery management system 12 is capable of comparing the current requirement 14 over the course of time to these preset current progressions to particularly fast recognize the respective types of the current peaks 15, 16, 17 based thereon. Thereby, the battery management system 12 is capable of particularly fast complying with the occurring current peaks 15, 16, 17 using the dielectric capacitance of the lithium ion battery 2.

In addition, the battery management system 12 is configured to cover the said difference between the actual current requirement 14 and the rated current 18 considering an actual state of charge of the dielectric capacitance of the lithium ion battery 2, thus of all of the dielectric capacitances of the individual battery cells 3. Further, the battery management system 12 can also consider a charging behavior of the dielectric capacitance of the lithium ion battery 2 in covering the said difference between the current requirement 14 and the rated current 18. Thus, the battery management system 12 is capable of exhausting the characteristics of the lithium ion battery 2 with regard to its dielectric capacitance such that the current requirement 14 can be particularly adequately and additionally also securely satisfied.

Further, the battery management system 12 can also consider very different quantities of the lithium ion battery 2 in using the dielectric capacitance. For example, the battery management system 12 can consider temperatures within the individual battery cells 3, internal resistances in the battery cells 3, states of charge of the individual battery cells 3 or also respective states of health, the so-called state of health, of the respective battery cells 3. Further, acceptable operating states of the lithium ion battery 2 can for example be defined in a characteristic map depending on very different environmental boundary conditions, such as for example the ambient temperature and the like, which the battery management system 12 also considers if it uses the dielectric capacitance of the lithium ion battery 2 to energetically cover the different current peaks 15, 16, 17 during the use of the battery-operated drill driver 1 as effectively as possible.

Thus, the dielectric effects of the lithium ion battery 2 inherent in the system are ideally exploited by the skillful battery management system 12, namely to the effect that high current peaks 15, 16, 17 can be covered despite of the comparatively slow electrochemical metabolism of the lithium ion battery 2, namely without damaging the lithium ion battery 2.

The invention claimed is:

1. A battery management system for a lithium ion battery of an electrical appliance, the system configured to:
   determine a difference between a current requirement of the electrical appliance and a preset rated current, which corresponds to an amount of charge capable of being electrochemically provided per time unit by a lithium ion battery due to maximally possible reaction speeds in the lithium ion battery;
   control an output current of the lithium ion battery to the electrical appliance in such a way that the difference is covered by using a dielectric capacitance of the lithium ion battery insofar as it is thereby not departed from preset acceptable operating states of the lithium ion battery.

2. The battery management system according to claim 1, wherein the battery management system is configured to cover the difference considering an actual state of charge of the dielectric capacitance of the lithium ion battery.

3. The battery management system according to claim 1, wherein the battery management system is configured to cover the difference considering a charging behavior of the dielectric capacitance of the lithium ion battery.

4. The battery management system according to claim 1, wherein the battery management system is configured to recognize different types of current peaks based on the current requirement and to use the dielectric capacitance of the lithium ion battery depending thereon for covering the difference between the current requirement of the electrical appliance and the preset rated current.

5. The battery management system according to claim 4, wherein the battery management system is configured to compare preset current progressions for the different types of current peaks to the current requirement and to recognize the respective types of current peaks based thereon.

6. The battery management system according to claim 1, wherein
the battery management system is configured to control the use of the dielectric capacitance of the lithium ion battery depending on at least one of the following quantities:
a temperature of the lithium ion battery;
an internal resistance of the lithium ion battery;
a state of charge of the lithium ion battery;
a state of health of the lithium ion battery.

7. A lithium ion battery for an electrical appliance with a battery management system, the system configured to:
determine a difference between a current requirement of the electrical appliance and a preset rated current, which corresponds to an amount of charge capable of being electrochemically provided per time unit by a lithium ion battery due to maximally possible reaction speeds in the lithium ion battery; and
control an output current of the lithium ion battery to the electrical appliance in such a way that the difference is covered by using a dielectric capacitance of the lithium ion battery insofar as it is thereby not departed from preset acceptable operating states of the lithium ion battery.

8. An electrical appliance with a lithium ion battery according to claim 7.

9. A method for operating a lithium ion battery of an electrical appliance comprising:
determining a difference between a current requirement of the electrical appliance and a preset rated current, which corresponds to an amount of charge capable of being electrochemically provided per time unit by a lithium ion battery due to maximally possible reaction speeds in the lithium ion battery; and
controlling an output current of the lithium ion battery to the electrical appliance in such a way that the difference is covered by using a dielectric capacitance of the lithium ion battery insofar as it is thereby not departed from preset acceptable operating states of the lithium ion battery.

* * * * *